US011127468B2

(12) United States Patent
Tailliet et al.

(10) Patent No.: US 11,127,468 B2
(45) Date of Patent: Sep. 21, 2021

(54) METHOD FOR ADDRESSING A NON-VOLATILE MEMORY ON I²C BUS AND CORRESPONDING MEMORY DEVICE

(71) Applicant: STMicroelectronics (Rousset) SAS, Rousset (FR)

(72) Inventors: François Tailliet, Fuveau (FR); Marc Battista, Allauch (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 235 days.

(21) Appl. No.: 15/842,586

(22) Filed: Dec. 14, 2017

(65) Prior Publication Data
US 2018/0301196 A1 Oct. 18, 2018

(30) Foreign Application Priority Data

Apr. 12, 2017 (FR) ...................................... 1753214

(51) Int. Cl.
*G06F 12/02* (2006.01)
*G11C 16/20* (2006.01)
(Continued)

(52) U.S. Cl.
CPC .......... *G11C 16/20* (2013.01); *G06F 12/0246* (2013.01); *G06F 13/4291* (2013.01);
(Continued)

(58) Field of Classification Search
CPC .. G06F 16/20; G06F 12/0246; G06F 9/30007; G11C 11/5628; G11C 16/102; G11C 16/12
See application file for complete search history.

(56) References Cited

U.S. PATENT DOCUMENTS

2005/0005049 A1 1/2005 Montalvo et al.
2008/0307154 A1* 12/2008 Naderi ................ G06F 12/0292
711/103
(Continued)

FOREIGN PATENT DOCUMENTS

CN 1731370 A 2/2006
CN 1996275 A 7/2007
(Continued)

OTHER PUBLICATIONS

NXP Semiconductors; UM10204—I2C-bus specification and user manual; Apr. 4, 2014; NXP Semiconductors; retrieved from <<http://nxp.com/docs/en/user-guide/UM10204.pdf>>; Revision 6; pp. 1-64. (Year: 2014).*

*Primary Examiner* — Jason W Blust
*Assistant Examiner* — Eric T Loonan
(74) *Attorney, Agent, or Firm* — Slater Matsil, LLP

(57) ABSTRACT

Some embodiments include a method for addressing an integrated circuit for a non-volatile memory of the EEPROM type on a bus of the I²C type. The memory includes J hardware-identification pins, with J being an integer lying between 1 and 3, which are assigned respective potentials defining an assignment code on J bits. The method includes a first mode of addressing used selectively when the assignment code is equal to a fixed reference code on J bits, and a second mode of addressing used selectively when the assignment code is different from the reference code. In the first mode, the memory plane of the non-volatile memory is addressed by a memory address contained in the last low-order bits of the slave address and in the first N bytes received. In the second mode, the memory plane is addressed by a memory address contained in the first N+1 bytes received.

21 Claims, 3 Drawing Sheets

(51) Int. Cl.
*G11C 16/10* (2006.01)
*G11C 11/56* (2006.01)
*G11C 16/12* (2006.01)
*G06F 13/42* (2006.01)
*G06F 9/30* (2018.01)

(52) U.S. Cl.
CPC ........ *G11C 11/5628* (2013.01); *G11C 16/102* (2013.01); *G11C 16/12* (2013.01); *G06F 9/30007* (2013.01)

(56) References Cited

U.S. PATENT DOCUMENTS

| | | |
|---|---|---|
| 2010/0005218 A1 | 1/2010 | Gower et al. |
| 2013/0314103 A1* | 11/2013 | Nakagawa ............... H04B 3/46 324/613 |
| 2014/0351489 A1* | 11/2014 | Tailliet ............... G11C 14/0063 711/103 |
| 2015/0046627 A1 | 2/2015 | Tailliet |

FOREIGN PATENT DOCUMENTS

| | | |
|---|---|---|
| CN | 103412829 A | 11/2013 |
| CN | 208421811 U | 1/2019 |
| EP | 2391095 A1 | 11/2011 |

\* cited by examiner

METHOD FOR ADDRESSING A NON-VOLATILE MEMORY ON I²C BUS AND CORRESPONDING MEMORY DEVICE

CROSS-REFERENCE TO RELATED APPLICATIONS

This application claims priority to French Application No. 1753214, filed on Apr. 12, 2017, which application is hereby incorporated herein by reference.

TECHNICAL FIELD

Embodiments and modes of implementation relate to non-volatile memories and particular embodiments relate to memories compatible with an I²C bus.

BACKGROUND

The I²C bus is a well-known inter-integrated circuit serial communication standard.

FIG. 1 represents the signals of an exemplary communication carried out on an I²C bus.

The I²C bus comprises two wires, a serial data line SDA and a serial clock line SCL, which transmit information between the apparatuses connected to the I²C bus. Each apparatus is recognized by a unique slave address (whether it is for example with a microcontroller, a memory or a keyboard interface) and can operate as a sender or a receiver, depending on the function of the apparatus. For example a memory can both receive and transmit data. In addition to the senders and receivers, the peripherals can also be considered to be masters or slaves during the transmission of data. A master is the device which triggers a transfer of data on the bus and generates the clock signals to allow this transfer. At that moment, any addressed device is considered to be a slave.

The line SDA is a bidirectional line and the data to be communicated via the I²C bus are materialized by signals that can have a HIGH level or a LOW level.

During a data transmission, the signal of the line SDA must be stable during the HIGH period of the clock signal. The HIGH or LOW state of the data line SDA can only change when the clock signal on the line SCL is LOW.

All the transactions begin with a starting condition "START" STT and terminate with an end condition "STOP" STP. A HIGH to LOW transition on the line SDA while SCL is HIGH defines a starting condition SIT. A LOW to HIGH transition on the line SDA while SCL is HIGH defines an end condition STP.

On the line SDA, the HIGH and LOW levels of the signal represent the logic values "1" and "0" respectively.

The data transfers follow the format represented by FIG. 1. After the starting condition STT, a slave address SLADR is dispatched. This address is coded on 7 bits followed by an eighth direction bit R/W, a "zero" indicates a transmission (or write) W, a "one" indicates a request for data (or read) R.

The data DATA1, DATA2 are transmitted byte-wise (i.e. 8 bits) on the line SDA. The number of bytes which can be transmitted per transfer is unlimited. Each byte must be followed by a confirmation bit ACK. By convention, the data DATA1, DATA2 are transferred with the high-order bit MSB in first position.

Confirmation takes place after each byte. The confirmation bit ACK allows the receiver to signal to the sender that the byte has been successfully received and that another byte can be dispatched.

A data transfer always terminates with an end condition STP generated by the master.

In a memory of the EEPROM type, digital data are customarily stored in memory locations arranged in a memory plane. The memory locations are tagged and accessible by respective memory addresses.

The direction bit R/W makes it possible to indicate whether the memory is requested to read data stored in the memory plane or to write new data in the memory plane.

When reading or writing, the first memory address to be accessed in the memory plane is communicated to the memory immediately after the slave address SLADR.

In the case of a communication with a non-volatile memory of the EEPROM (electrically erasable and programmable) type, the slave address SLADR is coded in a customary form of the type 1010XXX. The code 1010 is generally used to identify an EEPROM-type memory device, and the three low-order bits XXX of the slave address make it possible, if appropriate, to identify an EEPROM memory device from among several EEPROM memory devices connected to the same I²C bus.

In this case, the EEPROM memory device comprises three hardware-identification pins E0, E1, E2 which are brought to respective potentials defining an assignment code on three bits. The last three low-order bits of the slave address SLADR make it possible to select an EEPROM memory device from among several, by comparing the values XXX of the bits and the assignment code associated with each EEPROM memory device.

This is usually the case in particular for 512-kbit EEPROM memories, for which the memory address MEMADR to be read- or write-accessed is coded on 16 bits and is transmitted to the memory on the first two data bytes DATA1, DATA2.

SUMMARY

However, for the current memory technologies of the 4-Mbit high density EEPROM type, a memory address MEMADR is coded on 19 bits. The standard approach for addressing of such a 4-Mbit memory is to use the last three low-order bits of the slave address not to identify a device, but to communicate the first 3 high-order bits of the memory address MEMADR. The first two data bytes DATA1, DATA2 make it possible to communicate the remaining 16 bits of the 19-bit memory address MEMADR.

Consequently, current 4-Mbit memories cannot be identified by their respective assignment codes and it is impossible to connect more than one 4-Mbit memory to one and the same I²C bus.

Hence, a need exists to increase the storage capacity for memory of the EEPROM type on I²C buses.

In this regard there is proposed according to one aspect a method for addressing an integrated circuit for a non-volatile memory of the electrically erasable and programmable type, comprising a memory plane and able to be connected to a bus of the I²C type, and comprising J hardware-identification pins, with J an integer lying between 1 and 3. The method comprises an assignment of potentials on each of the pins defining for the integrated circuit an assignment code on J bits, a transmission of a slave address on the bus, and then a transfer of data bytes on the bus.

The method according to this aspect comprises when the memory plane of the memory is addressable on n bits, with n=8*N+M, N being a non-zero natural integer number and M an integer lying between 1 and 3: a first mode of addressing used selectively when the assignment code is equal to a fixed reference code on J bits, comprising an addressing of the memory plane of the non-volatile memory by a memory address contained in the last M low-order bits of the slave address and in the first N bytes received, and a second mode of addressing used selectively when the assignment code is different from the reference code, comprising an addressing of the memory plane by a memory address contained in the first N+1 bytes received.

Stated otherwise, the method according to this aspect makes it possible to address the memory plane of a non-volatile memory of the EEPROM type, 4-Mbit EEPROM memories in particular, either in a standard manner advantageously compatible with existing I²C bus systems (in the first mode of addressing), or in a way advantageously making it possible to install several non-volatile memories of the EEPROM type, for example of 4 Mbits, on one and the same I²C bus (in the second mode of addressing), and one or the other of these two modes of addressing is selectable by the value of the assignment code.

Thus, the method according to this aspect caters particularly well to the current needs for large memory capacity with high density 4-Mbit memories addressed on 19 bits (n=19, N=2, M=3), but is also suited to memories addressed on 10 or 11 bits (n=10, N=1, M=2 or n=11, N=1, M=3) or to potential future memories of very high density addressed on 26 or 27 bits (n=26, N=3, M=2 or n=27, N=3, M=3).

In the second mode of addressing, the method advantageously includes an identification between the assignment code and J bits from among the last three low-order bits of the slave address, making it possible to select a non-volatile memory integrated circuit from among $2^J-1$ non-volatile memory integrated circuits potentially connected to the same I²C bus and having different one-to-one respective assignment codes.

Indeed, with J hardware-identification pins, it is possible to define $2^J$ different assignment codes, an assignment code then making it possible to identify a memory from among others. In the second mode of addressing, the assignment code of a memory necessarily being different from the fixed reference code, it is therefore possible to identify and to select a memory from among $2^J-1$ memories potentially connected to one and the same I²C bus.

Thus, with J=3 hardware-identification pins, up to seven EEPROM memories, for example of 4 Mbits, can be identified by virtue of the assignment code and thus be connected to one and the same I²C bus.

According to one mode of implementation in which J is equal to 3, the reference code can be o-o-o, and for example a simple OR function between the three bits of the assignment code advantageously makes it possible to know whether the assignment code is equal to the reference code.

According to one mode of implementation in which J is equal to 2, the reference code can be o-o, and a simple OR function between the two bits of the assignment code advantageously makes it possible to know whether the assignment code is equal to the reference code.

For example, the non-volatile memory integrated circuit can have a memory capacity of 4 Mbits, with in this case n equal to 19, N equal to 2 and M equal to 3 and include three hardware-assignment pins, i.e., J equal to 3.

According to one embodiment, in the first mode of addressing, the method can include, in the case where M is equal to 2 or to 1 and J is equal to 3, an identification between 3-M bits of the assignment code and 3-M bits from among the last three low-order bits of the slave address, making it possible to select a non-volatile memory integrated circuit from among $2^{3-M}$ potential non-volatile memory integrated circuits connected to the same I²C bus and having different one-to-one respective assignment codes.

Indeed, when M is equal to 2 or to 1, 3-2=1 bit or 3-1=2 bits in the last three low-order bits of the slave address are available in the first mode of addressing, and can serve to identify and select a memory from among others. Thus, the corresponding 1 or 2 identification pins can allow identification and selection of acca memory from among $2^{3-M}$ memories potentially connected to the same I²C bus.

According to another aspect, there is proposed an integrated circuit for a non-volatile memory of the electrically erasable and programmable type, including a memory plane, able to be connected to a bus of the I²C type and including J hardware-identification pins, with J an integer lying between 1 and 3, which are intended to be assigned respective potentials defining for the integrated circuit an assignment code on J bits, the integrated circuit being configured to receive a slave address transmitted on the bus, and then to receive data bytes on the bus.

The integrated circuit according to this aspect is configured to, when the memory plane is addressable on n bits, with n=8*N+M, N being a non-zero natural integer number and M an integer lying between 1 and 3, selectively adopt as a function of the value of the assignment code: a first mode of addressing when the assignment code is equal to a fixed reference code on J bits, in which the memory plane is addressable by a memory address contained in the last M low-order bits of the slave address and in the first N data bytes received, or a second mode of addressing when the assignment code is different from the reference code, in which the memory plane is addressable by a memory address contained in the first N+1 data bytes received.

The integrated circuit advantageously includes a test circuit configured to carry out a logical test between signals present on the hardware-identification pins, and to place the integrated circuit in the first mode of addressing or in the second mode of addressing as a function of the result of this test.

Advantageously, the test circuit is configured so that the logical test includes a logical OR test between the logic values of the J bits of the assignment code. This corresponds for example to a reference code equal to o-o-o (for equal to 3) or to o-o (for J equal to 2).

According to one embodiment, the test circuit is configured to, in the second mode of addressing, compare the assignment code with J bits from among the last three low-order bits of the slave address, and, in the case of difference, place the integrated circuit in the standby phase awaiting a starting condition of the I²C protocol.

According to one embodiment in which M is equal to 2 or to 1 and J is equal to 3, the test circuit is configured to, in the first mode of addressing, compare 3-M bits of the assignment code with 3-M bits from among the last three low-order bits of the slave address, and, in the case of difference, place the integrated circuit in the standby phase awaiting a starting condition of the I²C protocol.

For example, the integrated circuit has a memory capacity of 4 Mbits, with n equal to 19, N equal to 2 and M equal to 3 and includes three hardware-assignment pins, i.e. J equal to 3.

There is also proposed a system advantageously including $2^J-1$ non-volatile memory integrated circuits such as defined hereinabove, linked via one and the same I²C bus to at least one master device.

The system can be embodied in an integrated manner, for example in a system on chip (SoC).

An electronic apparatus, forming for example a mobile telephone or an auditory prosthesis, advantageously includes a system such as defined hereinabove.

BRIEF DESCRIPTION OF THE DRAWINGS

Other advantages and characteristics of the invention will be apparent on examining the detailed description of wholly non-limiting embodiments and modes of implementation, and the appended drawings in which.

DETAILED DESCRIPTION OF ILLUSTRATIVE EMBODIMENTS

Figure 1:
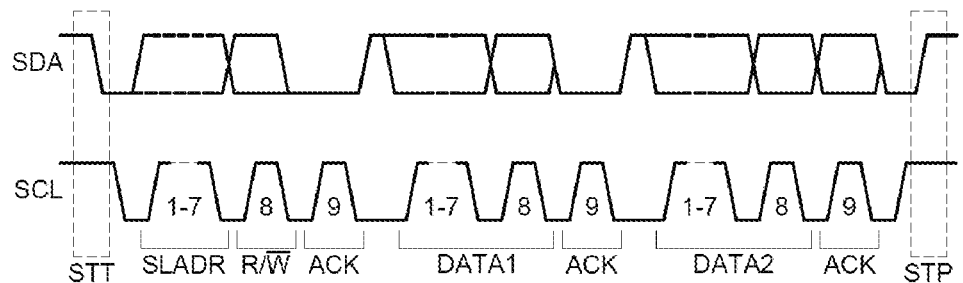
FIG. 1, described previously, represents the signals of an exemplary communication carried out on an I²C bus.
Figure 2:
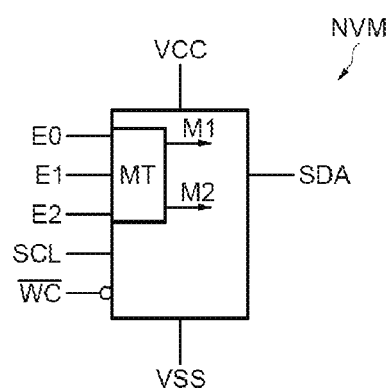
FIGS. 2 to 5 represent examples of modes of implementation and of embodiment of the invention.

FIG. 2 represents an EEPROM-type 4-Mbit non-volatile memory integrated circuit NVM, able to communicate on a bus of the I²C type and including in this example J=3 hardware-identification pins E0, E1, E2.

Other memory devices can include J=2, or J=1 hardware-identification pin(s), although the principle introduced previously and detailed according to exemplary embodiments hereinafter is preferably applied to J=3, and then to J=2 and then to J=1.

The non-volatile memory integrated circuit includes a memory plane making it possible to store digital data in memory locations arranged in rows and columns. A memory location generally includes a floating-gate transistor able to physically store a representation of a digital datum (that is to say a bit), in a conventional manner known per se. Each bit is stored in a memory location and is assigned a respective memory address, the communication of this address allowing the memory to read- or write-access this memory location.

For example, for a 4-Mbit EEPROM memory, a memory address is coded on n=19 bits, with, according to the equation n=8*N+M, N=2 and M=3.

The integrated circuit NVM also includes a serial data line SDA input/output and a serial clock line SCL input, two power supply terminals VCC and VSS, as well as a write control pin WC.

The terminal VCC is intended to receive a supply voltage, and the terminal VSS a reference voltage such as earth.

The SDA input/output is used to transfer incoming or outgoing data.

The signal applied to the SCL input is used to regulate the incoming and outgoing signals on the line SDA.

The signal present on the write control pin makes it possible to protect the content of the memory from accidental writing operations. The writing operations are rendered impossible in the memory when the signal present on the write control pin WC is at a high level. The writing operations are possible when the signal present on the write control pin WC is at a low level or left floating.

The hardware-identification pins E0, E1, E2 are intended to be assigned a respective potential defining an assignment code dedicated to the integrated circuit NVM. The assignment of these potentials is performed in a hardware manner during the integration of the integrated circuit on a card for example.

These hardware-identification pins E0, E1, E2 are coupled to VCC or VSS. When they are not connected, these inputs are typically read by default at VSS (e.g., ground). A coupling to VCC defines a logic signal of value "1" in the assignment code, and a coupling to VSS defines a logic signal of value "0".

The non-volatile memory integrated circuit NVM is configured to operate according to a first mode of addressing M1, or according to a second mode of addressing M2, as a function of the assignment code defined by the respective couplings of the hardware-identification pins E0, E1, E2 to the voltages VCC or VSS.

A test circuit MT makes it possible to verify whether or not the assignment code is equal to a reference code, and is furthermore configured to place the integrated circuit NVM in the first mode of addressing M1 or in the second mode of addressing M2, as a function of the result of this test.

For example, the test circuit MT is configured to carry out a logical test between signals present on the three hardware-identification pins E0, E1, E2.

For example, the reference code can be o-o-o, and the test carried out by the test circuit MT is a logical OR test between the three logic values of the signals present on the hardware-identification pins. Thus, if the result of this test is "o", the assignment code is equal to "0-0-0", otherwise, the assignment code includes at least one "1".

In the first mode of addressing M1, the integrated circuit NVM is intended to receive the data A18-A0 of a memory address MEMADR of the memory plane, which address is contained in the last three low-order bits LSB of the slave address SLADR and in the first two data bytes DATA1, DATA2.

In the second mode of addressing M2, the integrated circuit NVM is intended to receive the data A18-A0 of a memory address MEMADR of the memory plane, which address is contained in the first three data bytes DATA1, DATA2, DATA3.

These first and second modes of addressing correspond here to a memory having a capacity of 4 Mbits, of which a memory address is coded on 19 bits.

More generally, these first and second modes of addressing can be suited to memories whose memory addresses are coded on n=8*N+M bits, with N a non-zero natural integer number and M an integer equal to 2 or 3, such as memories of 2 Mbits (n=18, N=2, M=2), of 4 Mbits (n=19, N=2, M=3) or of 1 Gbits (n=27, N=3, M=3).

Thus, in the first mode of addressing M1, a memory address MEMADR is contained in the last M low-order bits LSB of the slave address SLADR and in the first N data bytes, and in the second mode of addressing M2, a memory address MEMADR is contained in the first N+1 data bytes.

Furthermore, in the second mode of addressing M2, the integrated circuit NVM is set up to identify the last three low-order bits LSB of the slave address SLADR with its own assignment code E2-E1-E0 defined by hard-wiring.

This makes it possible to be able to select a non-volatile memory integrated circuit from among a potential plurality of non-volatile memory integrated circuits NVM1-NVMn connected to one and the same I²C bus by allocating them different one-to-one respective assignment codes.

More precisely, in the case where M=3, up to seven integrated circuits NVM can be connected to the same I²C bus, corresponding to the 8 possible combinations of the assignment code E2-E1-E0, removed from the reference code. Thus the maximum capacity of EEPROM non-volatile memory on one and the same I²C bus can be 28 Mbits (in the example of 4-Mbit memories).

In the case where M=2, for example for 2-Mbit memories, the combination Xoo forms an exemplary reference code, with X the value on the arbitrary pin E2.

In the first mode of addressing, it is possible to select a 2-Mbit memory from among 2 on the same I²C bus with the pin E2 (by identification of the remaining bit X). The other combinations involve the second mode of operation, with a communication of the memory address on 3 bytes, and a possibility of placing 6 memories on the same bus (the combinations E2-E1-E0=0-0-0 and E2-E1-E0=1-0-0 corresponding to the first mode of addressing and the 6 remaining combinations for the second mode of addressing being 0-0-1, 1-0-1, 0-1-0,1-1-0, 0-1-1,1-1-1).

Figure 3:
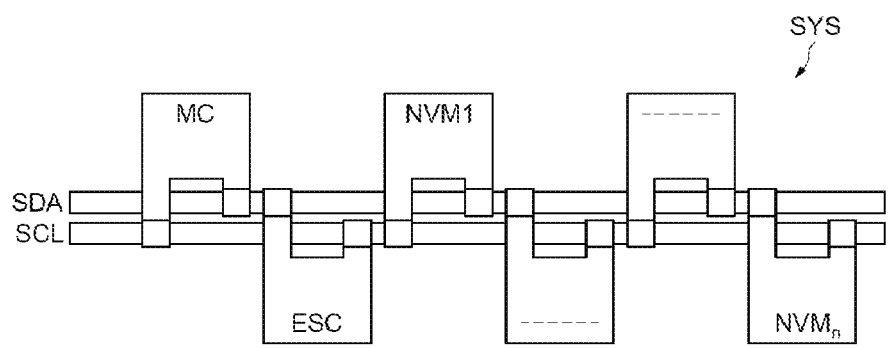

FIG. 3 represents a system SYS including one to seven non-volatile memory integrated circuits NVM1-NVMn, with n the number of integrated circuits. The integrated circuits NVM1-NVMn are linked via one and the same bus of the I²C type to a master device MC such as a microcontroller. Other slave or master devices can also be connected to the I²C bus.

For example this system SYS can be embodied in an integrated manner into a system on chip SOC.

Figure 4:
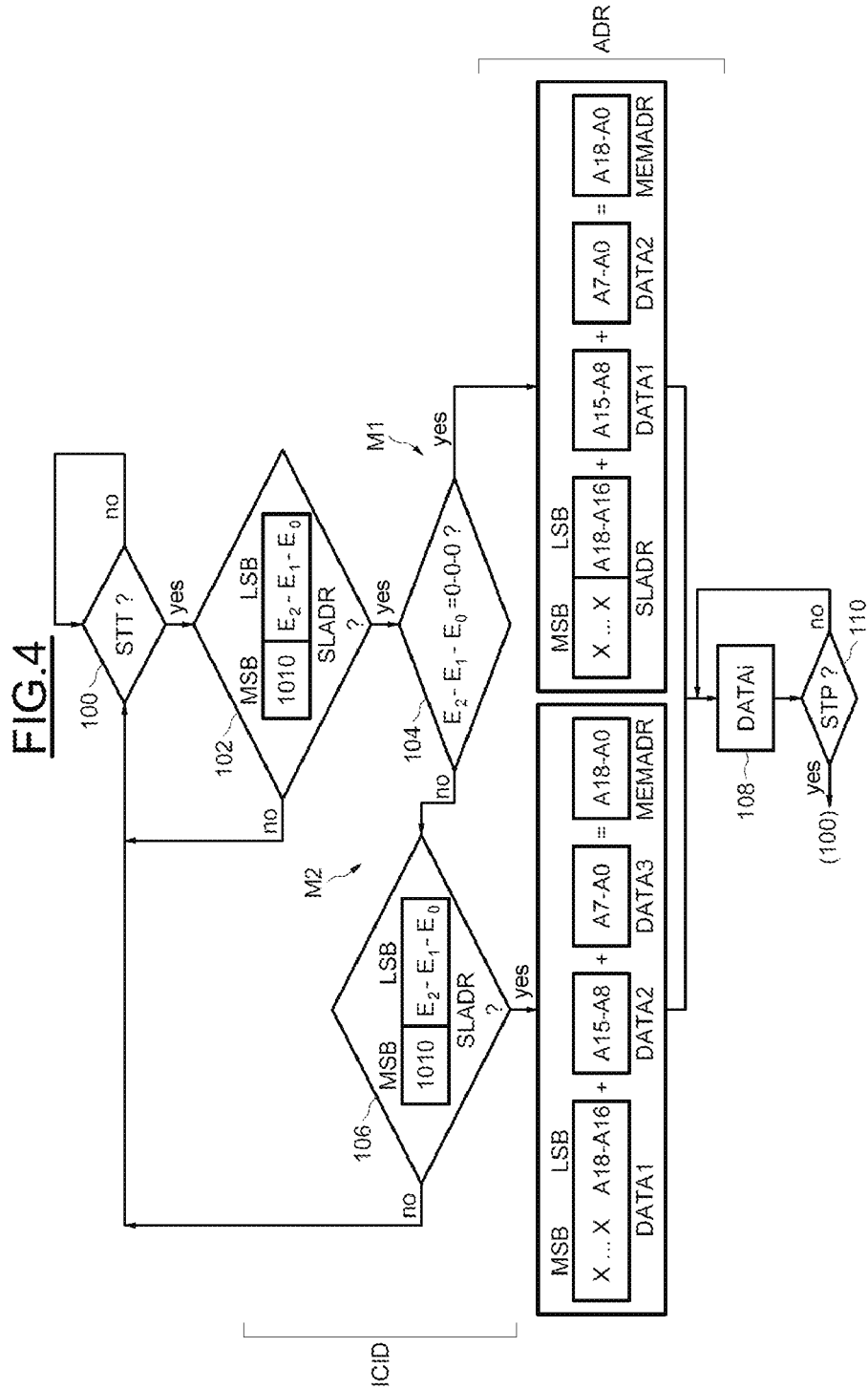

FIG. 4 is a chart representing the implementation of addressing of a memory of the 4-Mbit EEPROM type on a bus of the I²C type having two modes of addressing M1, M2, of the type of the integrated circuit NVM described in conjunction with FIG. 2.

It is considered that the integrated circuit NVM is supplied on its power supply terminals, VCC, VSS, connected to an I²C bus and that its hardware-identification pins E0, E1, E2 are brought to high or low voltages forming a three-bit assignment code.

The memory NVM is initially in a standby phase 100 awaiting the starting condition STT. As long as a starting condition is not sent on the I²C bus, the memory NVM remains in the standby phase 100.

When a starting condition STT is sent on the I²C bus, a slave address SLADR is transmitted afterwards. A step of so-called integrated circuit identification ICID allows the various slave devices to recognize one another, in relation to the slave address SLADR, if their function is requested. The slave address SLADR includes in this example 7 bits.

In this example the code making it possible to identify an EEPROM memory device is 1010. Thus, the memory NVM tests (102) whether the first four high-order bits MSB of the slave address SLADR form the code 1010.

If this is not the case, then the memory is placed back in the standby phase 100.

If the communication on the I²C bus is addressed to an EEPROM memory, then a test circuit MT of the memory integrated circuit NVM tests (104) whether the assignment code which has been associated with it by wiring is equal to a reference code.

The reference code is 0-0-0 in this example, this corresponds to a wiring of the three hardware-identification pins E0, E1, E2 to a reference voltage signal VSS. The test can thus be implemented by an OR logic function between the three bits of the assignment code. Nonetheless any reference code can be chosen in association with a test 104 corresponding to this reference code.

If the result of the test 104 is "true" (or "yes") then the integrated circuit is placed in a first mode of addressing M1.

The first mode of addressing M1 corresponds, for the following steps, to the customary operation of a 4-Mbit EEPROM memory, advantageously compatible with numerous existing systems using an I²C bus, but not being able to include more than a single 4-Mbit EEPROM memory.

It is recalled that in this mode of addressing, the 19 bits A18-A0 of the memory address MEMADR of the memory plane are transmitted, in the order from the first high-order bit A18 to the last low-order bit A0, by anticipation in the last three low-order bits LSB of the slave address SLADR, and then in the first data byte DATA1, and then in the second data byte DATA2.

More generally, in the first mode of addressing M1, a memory address MEMADR is contained in the last M low-order bits LSB of the slave address SLADR and in the first N data bytes, in the case of a memory address coded on n bits, with n=8*N+M, N being a non-zero natural integer number and M a number equal to 2 or to 3.

The data bytes following DATAi include the data to be written W received by the memory NVM or the data read R and sent by the memory NVM. These data are transmitted during a transfer step 108 which ends upon communication 110 of an end condition STP. The memory NVM is then placed in the standby phase 100 again.

On the other hand, if the result of the test 104 is "false" (or "no") then the integrated circuit is placed in a second mode of addressing M2.

The second mode of addressing M2 advantageously makes it possible to be able to connect a plurality of non-volatile memories in series, in particular from one to seven 4-Mbit EEPROM memories.

In this second mode of addressing M2, the 19 bits A18-A0 of the memory address MEMADR of the memory plane are transmitted, in the order from the first high-order bit A18 to the last low-order bit A0, in the content of the first three data bytes DATA1, DATA2, DATA3.

More generally, in the second mode of addressing M2, a memory address MEMADR is communicated in an extended manner in the content of the first N+1 data bytes.

Consequently the last three low-order bits LSB of the slave address SLADR are "available" to implement a hardware identification between various EEPROM-type memory integrated circuits NVM on the same I²C bus.

Thus, during the integrated circuit identification step ICID, the memory NVM tests (106) whether the assignment code E0-E1-E2 which has been assigned to it by wiring corresponds to the last three low-order bits LSB of the slave address SLADR.

If this is not the case, then the master device seeks to address itself to another EEPROM-type memory integrated circuit on the I²C bus and the memory is placed back in the standby phase 100.

If this is the case, the memory is identified, receives the 19 bits A18-A0 of memory address MEMADR that is contained in the first three data bytes DATA1-DATA3 and implements reads R or writes W of the following data bytes DATAi during the transfer step 108.

Likewise, the transfer step 108 ends upon a communication 110 of end condition STP and the memory NVM then places itself in the standby phase 100 again.

In this second mode of addressing M2, seven assignment codes are available to carry out a memory integrated circuit NVM identification. Indeed the seven available assignment codes correspond to the eight possible combinations of a three-bit code, removed from the combination of the reference code reserved for the implementation of the first mode of addressing M1.

Figure 5:
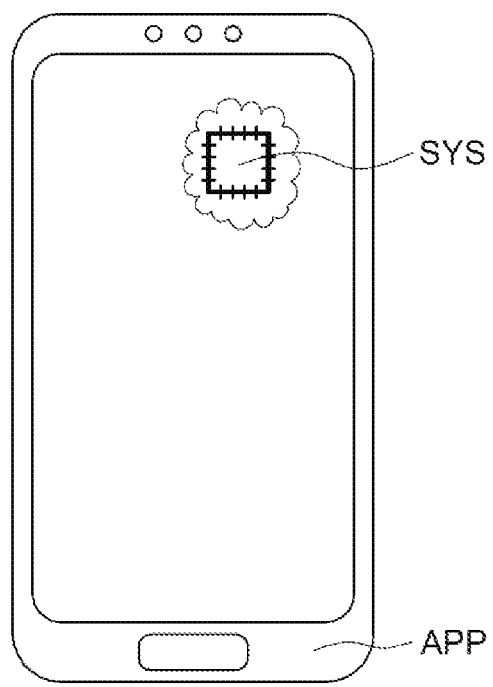

FIG. 5 represents an electronic apparatus APP including a system SYS in which a plurality of non-volatile memory integrated circuits NVM wired up to one and the same I²C bus, as well as for example a master device MC such as a microcontroller.

Moreover, the system SYS can for example be embodied in the form of a complete system on chip.

Here, the electronic apparatus APP represents the example of a mobile telephone, but it will be apparent to the person skilled in the art that the embodiments of such a system SYS or of such an integrated circuit NVM which were detailed previously can be included with any other known product not described here.

Moreover the invention is not limited to these embodiments but embraces all variants thereof. For example, the invention is particularly well suited to 4-Mbit EEPROM memories, but is also suitable for any addressable memory on n bits, with n=8*N+M (N being a non-zero natural integer and M equal to 2 or to 3) such as 16-kbit memories or future 1-Gbit memories. Although the slave address of the I²C protocol has been described coded on 7 bits, the invention is also suited to a slave address coded on 10 bits. Likewise, though the preferential example described hereinabove is applied to J=3 hardware-identification terminals, the invention is also suited to integrated circuits including 2 or 1 hardware-identification pin(s).

What is claimed is:

1. A method for addressing a non-volatile memory integrated circuit having a non-volatile memory of the electrically erasable and programmable type, the non-volatile memory configured to be connected to a serial bus comprising a clock line and a data line, the non-volatile memory comprising a memory plane and J hardware-identification pins, wherein J is a positive integer number higher than or equal to 1 and lower than or equal to 3, the method comprising:
    assigning a voltage to each of the J hardware-identification pins of the non-volatile memory to form a first code;
    transmitting a starting condition by transitioning the data line from a high state to a low state while the clock line is in the high state;
    after transmitting the starting condition, transmitting a slave address on the serial bus, the slave address comprising 7 bits;
    after transmitting the slave address, transmitting a read/write bit on the serial bus;
    after transmitting the read/write bit, transmitting data bytes on the serial bus; and
    after transmitting the data bytes, transmitting an end condition by transitioning the data line from the low state to the high state while the clock line is in the high state, wherein the memory plane of the non-volatile memory is addressable with n bits, wherein n=8*N+M, N being a non-zero positive integer number and M being a positive integer number higher than or equal to 1 and lower than or equal to 3, and wherein:
    a first mode of addressing the non-volatile memory is selected when the first code is equal to a fixed reference code, the first mode of addressing the memory plane of the non-volatile memory comprising an addressing of the memory plane of the non-volatile memory by a memory address contained in a last M low-order bits of the slave address and in a first N bytes received in the data bytes,
    a second mode of addressing the non-volatile memory is selected when the first code is different from the reference code, the second mode of addressing the memory plane of the non-volatile memory comprising an addressing of the memory plane by a memory address contained in a first N+1 bytes received in the data bytes,
    when the first mode is selected, selecting the non-volatile memory integrated circuit for communication over the serial bus based on a first 7-M bits of the slave address, and
    when the second mode is selected, selecting the non-volatile memory integrated circuit for communication over the serial bus based on the 7 bits of the slave address.

2. The method of claim 1, further comprising in the second mode of addressing the non-volatile memory, selecting the non-volatile memory integrated circuit for communication over the serial bus when the first code is equal to the last three low-order bits of the slave address.

3. The method of claim 1, further comprising coupling (2^J)-1 non-volatile memory integrated circuits to the serial bus.

4. The method of claim 3, wherein each of the non-volatile memory integrated circuits coupled to the serial bus have the same memory capacity.

5. The method of claim 1, wherein J is equal to 3 and the reference code is 0-0-0.

6. The method of claim 1, wherein:
    the non-volatile memory has a memory capacity of 4 Mbits;
    n is equal to 19;
    N is equal to 2;
    M is equal to 3; and
    J is equal to 3.

7. The method of claim 1, wherein J is equal to 2; and the reference code is o-o.

8. The method of claim 1, further comprising, in the first mode of addressing and when M is equal to 2 or to 1 and J is equal to 3, selecting the non-volatile memory based on a last three low-order bits of the slave address.

9. The method of claim 8, wherein the non-volatile memory is selected from among 2^(3-M) non-volatile memory integrated circuits connected to the serial bus.

10. An integrated circuit comprising an electrically erasable and programmable non-volatile memory configured to be connected to a serial bus comprising a clock line and a data line, the non-volatile memory comprising a memory plane and J hardware-identification pins, wherein J is a positive integer number higher than or equal to between 1 and lower than or equal to 3, the J hardware-identification pins configured to receive a voltage to form a first code, wherein the integrated circuit is configured to:
    receive a starting condition on the serial bus, the starting condition comprising a transition of the data line from a high state to a low state while the clock line is in the high state;
    after receiving the starting condition, receive a slave address transmitted on the serial bus, the slave address comprising 7 bits;
    after receiving the slave address, receive a read/write bit on the serial bus;
    after receiving the read/write bit, receive data bytes transmitted on the serial bus;
    after receiving the data bytes, receive an end condition, wherein the end condition comprises a transition of the data line from the low state to the high state while the clock line is in the high state; and
    select between a first mode and a second mode of addressing the memory plane, wherein the first mode is selected when the first code is equal to a reference code and the second mode is selected when the first code is different from the reference code, wherein the memory plane is addressable by n bits, n=8*N+M, N being a non-zero positive integer number and M being a positive integer number higher than or equal to 1 and lower than or equal to 3, and wherein the first mode of addressing the memory plane comprises an addressing of the memory plane of the non-volatile memory by a memory address contained in a last M low-order bits of the slave address and in a first N data bytes received, and the second mode of addressing the memory plane comprises an addressing of the memory plane of the non-volatile memory by a memory address contained in a first N+1 data bytes received, and wherein, when the first mode is selected, the integrated circuit is configured to be selected for communication over the serial bus based on a first 7-M bits of the slave address, and when the second mode is selected, the integrated circuit is configured to be selected for communication over the serial bus based on the 7 bits of the slave address.

11. The integrated circuit of claim 10, further comprising a test circuit configured to:
carry out a logical test between signals present on the J hardware-identification pins to produce a test result; and
place the integrated circuit in the first mode or the second mode of addressing the memory plane based on the test result.

12. The integrated circuit of claim 11, wherein the test circuit comprises an OR gate having inputs coupled to the J hardware-identification pins and an output configure to generate the test result.

13. The integrated circuit of claim 11, wherein, in the second mode of addressing the memory plane, the test circuit is configured to:
compare the first code with a last three low-order bits (LSBs) of the slave address; and
place the integrated circuit in standby phase when the first code is different from the last three LSBs of the slave address.

14. The integrated circuit of claim 11, wherein:
M is equal to 2 or 1;
J is equal to 3; and
in the first mode of addressing, the test circuit is configured to place the integrated circuit in a standby phase based on bits of the slave address.

15. The integrated circuit of claim 10, wherein the non-volatile memory has a capacity of 4 Mbits, n is equal to 19, N is equal to 2 and M is equal to 3 and J is equal to 3.

16. A system comprising:
a first memory device having a memory plane with a capacity of 4 Mbits, the first memory device comprising 3 identification pins, and an SDA and an SCL pins, the SDA and SCL pins configured to be coupled to a serial bus comprising a clock line and a data line, wherein each of the 3 identification pins are configured to receive a voltage to produce a first code, the first memory device having a first mode and a second mode of addressing the memory plane, wherein the first memory device operates with the first mode of addressing the memory plane when the first code is equal to a reference code, and the first memory device operates in the second mode of addressing the memory plane when the first code is different than the reference code, and wherein:
a serial communication transaction comprises:
a starting condition defined by a transition of the data line from a high state to a low state while the clock line is in the high state,
after the starting condition, a slave address comprising 7 bits,
after the slave address, a read/write bit,
after the read/write bit, a plurality of data bytes, and
after the plurality of data bytes, an end condition defined by a transition of the data line from the low state to the high state while the clock line is in the high state,
the first mode of addressing the first memory device comprises addressing the memory plane by using a lower 3 bits of a slave address of the serial communication transaction plus 16 bits from two 8-bit data bytes received after the slave address,
the second mode of addressing the first memory device comprising using 19 bits from three 8-bit data bytes received after the slave address,
when the first mode is selected, the first memory device is configured to be selected for communication over the serial bus based on a first 4 bits of the slave address, and
when the second mode is selected, the first memory device is configured to be selected for communication over the serial bus based on the 7 bits of the slave address.

17. The system of claim 16, wherein, when the first code is different than the reference code, the first memory device is selected when the lower 3 bits of the slave address are equal to the first code.

18. The system of claim 16, wherein the reference code is 0-0-0.

19. The system of claim 18, further comprising two to six additional memory devices, each of the two to six additional memory devices having a memory plane with a capacity of 4 Mbits, 3 identification pins, and an SDA and SCL pins coupled to the serial bus, wherein the first memory device and each of the two to six additional devices have respective first codes different from each other and different from the reference code.

20. The system of claim 16, further comprising a master device coupled to the serial bus.

21. The system of claim 16, wherein the system is comprised in a mobile telephone or an auditory prosthesis.

* * * * *

UNITED STATES PATENT AND TRADEMARK OFFICE
CERTIFICATE OF CORRECTION

PATENT NO. : 11,127,468 B2
APPLICATION NO. : 15/842586
DATED : September 21, 2021
INVENTOR(S) : Tailliet et al.

Page 1 of 1

It is certified that error appears in the above-identified patent and that said Letters Patent is hereby corrected as shown below:

In the Claims

Claim 10, Column 10, Line 43; delete "between" after "to".

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*